United States Patent [19]

Geisler et al.

[11] Patent Number: 5,378,284
[45] Date of Patent: Jan. 3, 1995

[54] APPARATUS FOR COATING SUBSTRATES USING A MICROWAVE ECR PLASMA SOURCE

[75] Inventors: Michael Geisler, Waechtersbach; Rudolf Koetter-Faulhaber, Karben; Michael Jung, Kahl/Main, all of Germany

[73] Assignee: Leybold Aktiengesellschaft, Hanau, Germany

[21] Appl. No.: 908,446

[22] Filed: Jun. 30, 1992

Related U.S. Application Data

[63] Continuation-in-part of Ser. No. 661,218, Feb. 27, 1991, abandoned.

[51] Int. Cl.$^6$ .............................................. C23C 16/50
[52] U.S. Cl. ................. 118/723 MR; 118/723 MP; 118/703MA; 118/723 AN; 118/724; 118/725; 118/730
[58] Field of Search ...... 118/723, 724, 730, 723 MW, 118/723 ME, 723 MR, 723 MA, 723 AN, 723 MP, 725; 427/569, 575; 156/345

[56] References Cited

U.S. PATENT DOCUMENTS

| | | |
|---|---|---|
| 4,532,199 | 7/1985 | Ueno et al. .......................... 118/723 |
| 4,582,720 | 4/1986 | Yamazaki . |
| 4,915,979 | 4/1990 | Ishida et al. . |
| 4,970,435 | 11/1990 | Tanaka et al. ....................... 118/715 |

FOREIGN PATENT DOCUMENTS

| | | |
|---|---|---|
| 0284190 | 9/1988 | European Pat. Off. . |
| 3731686 | 4/1989 | Germany . |
| 58-208326 | 12/1983 | Japan . |
| 63-255374 | 10/1987 | Japan . |
| 01100275A | 4/1989 | Japan ................................... 118/723 |
| 1-316464 | 12/1989 | Japan . |

OTHER PUBLICATIONS

Tamura, "Production of Electrophotographic Sensitive Body", Pat. Abstract of Japan, B and 13, No. 63, 13 Feb. 1989.

Watanabe, "Glow Discharge Cracker", Pat. Abstracts of Japan B and 14, No. 115, 5 Mar. 1990.

Herak et al., "Effects of Substrate Bias on Structure and Properties of a SiiH Films Deposited by ECR Microwave Plasmas", Journal of Non -Crystalline Solids, pp. 277-280 (1987).

Kato et al., "Preparation of silicon nitride films at room temperature using double-tubed coaxial line-type microwave plasma chemical vapor deposition system", Journal of Applied Physics, pp. 492-497 (1987).

Primary Examiner—Nam Nguyen
Assistant Examiner—Jonathan D. Baskin
Attorney, Agent, or Firm—Hill, Steadman & Simpson

[57] ABSTRACT

An apparatus and a method for producing layers on the surfaces of workpieces, preferably on spotlight, or headlight, reflector inserts formed of plastic, includes an apparatus having a vacuum chamber that can be operated as a batch system with a PCVD coating process, where a microwave ECR plasma coating source is used, and the workpieces to be coated are secured to a rotary cage arranged in the vacuum chamber. The rotary cage can be conducted past a microwave coating source with a frequency-matched and phase-matched planetary motion. Such a coating process can be used in a vacuum chamber, under plasma, and at pressures below $2 \times 10^{-2}$ mbar.

7 Claims, 3 Drawing Sheets

APPARATUS FOR COATING SUBSTRATES USING A MICROWAVE ECR PLASMA SOURCE

This is a continuation-in-part of application Ser. No. 661,218 filed Feb. 27, 1991.

BACKGROUND OF THE INVENTION

The present invention relates to a method and an apparatus for providing layers on the surfaces of workpieces, such as spotlight reflector inserts formed of plastic.

To coat a workpiece, such as a front surface mirror of a spotlight reflector insert, a vacuum chamber can be operated as a batching system, and a Plasma Chemical Vapor Deposition (PCVD) coating process, having a microwave Electron Cyclotron Resonance (ECR) plasma coating source, is used to coat the workpiece. The workpieces to be coated are secured to a rotary cage within the vacuum chamber. The rotary cage is conducted past the coating source with a frequency and phase-matched planetary motion.

German Patent DE 37 05 666 discusses an apparatus for producing a plasma and treating workpieces therein. A coating process used to coat a substrate, such as a band-shaped workpiece, is performed with the assistance of a microwave ECR plasma coating source.

German Patent DE 37 31 686 discusses a method and apparatus for depositing a corrosion-resistant layer onto the surfaces of lacquer-coated workpieces. A layer system is deposited onto the workpieces in a vacuum chamber with the assistance of a glow cathode and an evaporator.

In the above-discussed methods, the anti-corrosive layers are composed of a dielectric, or substantially dielectric material. Above thicknesses of approximately 100–200 nm, these layers are good insulators.

Traditional systems for applying protective coating layers to motor vehicle reflectors are operated using DC-PCVD technology. In using these systems, however, steadily growing layers form on the electrodes during the coating process. These layers reach a critical thickness for electrical conductivity within a short period of time, and thereafter, function as insulators. As a result of this layer growth, a glow discharge cannot be maintained to produce corrosion-resistant layers in a system operated with DC voltage. Further, as a result of the layer build-up, the electrodes must be cleaned, by flooding the process chamber, after each batch. However, flooding the process chamber is always accompanied by an enormous generation of fine dust particles, making it necessary to perform an involved cleaning of the entire process chamber. Thus, operation of a DC-PCVD system is extremely personnel intensive and cost-intensive. Further, DC-PCVD technology lacks in-line capabilities, as it has a limited attainable pressure range of a few mbars, and requires repeated cleaning of the process chamber.

One disadvantage of the DC-PCVD coating process is that the process cannot reliably manufacture layers exceeding approximately 100 nm. The DC glow discharge used in a DC-PCVD process is operated at a pressure range of a few mbars. Plasma flow at this pressure is highly viscous and turbulent, and thus, neither manageable nor controllable. As a result, it is difficult to provide a uniformly thick layer distribution within the operable pressure range.

A significant disadvantage of the DC-PCVD method is that the pre-lacquering layer has a lifetime of only a few hours, and thus, workpieces, such as base members of reflectors, that have been aluminized in one step will not adhere well to a subsequently applied protective-coating layer. Therefore, the workpieces must be further-processed shortly after applying the pre-lacquering layer. Because of the time dependence between the production steps of pre-lacquering and vacuum coating, storage between these steps is impossible.

SUMMARY OF THE INVENTION

The present invention provides an apparatus and a method for depositing dielectric layers of an arbitrary thickness onto a workpiece in a continuous, cost-beneficial operation. The apparatus and method result in layers having improved corrosion-resistance and smearing characteristics over layers produced by a DC-PCVD method.

To this end, the apparatus of the present invention allows for the production of layers of arbitrary thickness on a surface of a workpiece to be operated as a batch system using a plasma chemical vapor deposition coating process by providing a vacuum chamber, a rotary cage arranged in the vacuum chamber, such that the rotary cage is capable of rotation with a frequency and phase-matched planetary motion, and coating means for coating workpieces secured to the rotary cage, the coating means having a microwave ECR plasma coating source, including a microwave field operated at a frequency of 2.45 GHz.

The present invention also provides a method for depositing layers of an arbitrary thickness on a surface of a workpiece to be operated as a batch system using a plasma chemical vapor deposition process. The method includes coating the workpiece by a coating process under plasma at pressures below $2 \times 10^{-2}$ mbar.

The microwave ECR plasma coating source can be used in an in-line system.

In an embodiment, the microwave ECR plasma coating source includes a microwave transmitter for generating the plasma, which can be used in either a pulsed or a continuous mode.

In a preferred embodiment, the microwave field is operated at a frequency of 2.45 GHz, and a high-vacuum pump, that can include a controllable valve for selectively varying the pumping capacity of the high-vacuum pump, is connected to the vacuum chamber. Preferably, the controllable valve precedes the high-vacuum pump.

In an embodiment, a number of heated gas distribution conduits for carrying process gasses are mounted between a number of free magnet poles in the vacuum chamber.

In another embodiment, a bias voltage is supplied to the workpiece via the rotary cage insulated vis-a-vis ground.

In an embodiment of the method of the invention, the workpiece is pre-treated in a plasma-assisted $CF_4/O_2$ gas atmosphere. The surface of the workpiece can De modified with 0-containing plasma and N-containing plasmas.

In an embodiment, a leveling layer is applied to the workpiece. The leveling layer can include a SiCO layer. Further, an adhesion promoting layer can be applied to the workpiece in the presence of a gas atmosphere containing SiC or SiCO. A protective layer of SiC or SiCO can be applied to the workpiece. The SiC layer can be fluoridated.

In another embodiment, an aluminum layer is superficially oxidized with plasma in an $O_2$-containing process atmosphere. Either a SiC or a SiCO protective coating layer can be superficially oxidized in the vacuum chamber.

In yet another embodiment, a silicate layer or crystal layer is applied to the workpiece in the presence of water, the silicate or crystal layer serving as a top layer.

In a preferred embodiment, mixing metals in the atmosphere contained in the vacuum chamber has a catalytic effect on the PCVD process.

DETAILED DESCRIPTION OF THE PRESENTLY PREFERRED EMBODIMENTS

The present invention provides a method and apparatus for manufacturing layers on the surfaces of workpieces. Pursuant to the method, a vacuum chamber is provided that can be operated as a batch system with a PCVD coating process, wherein a microwave ECR plasma coating source is used, and the workpieces to be coated are secured to a rotary cage located in the vacuum chamber.

Figure 1:
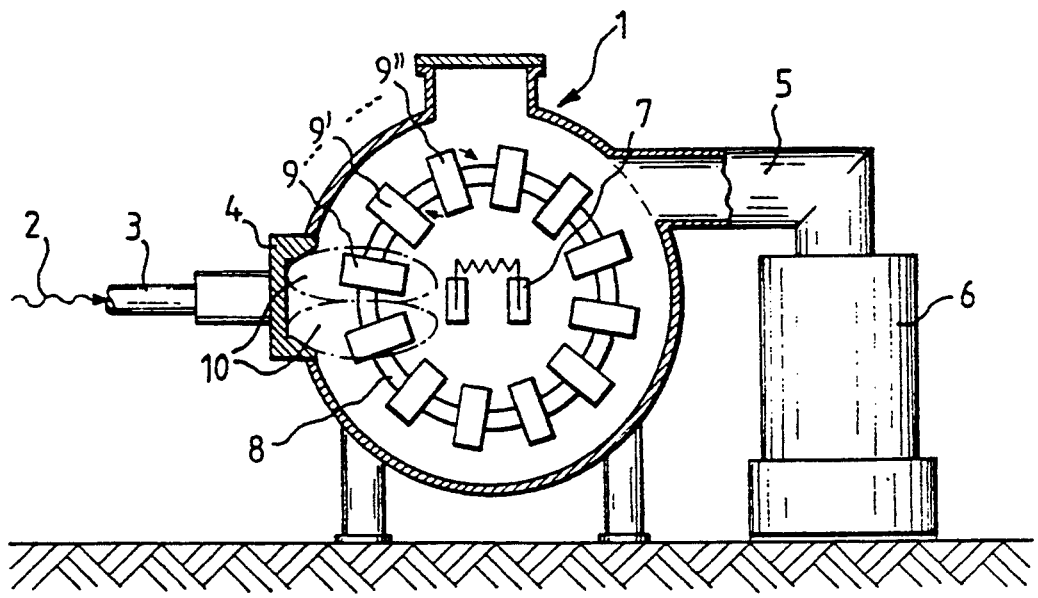
FIG. 1 is a side view of an embodiment of the apparatus for coating workpieces including a sectional view of a cylindrical vacuum chamber.

Referring to FIG. 1, as illustrated, a microwave source 2, a waveguide 3, and a horn antenna 4 are disposed perpendicularly to a central longitudinal axis of a cylindrical vacuum chamber 1, and attached along the cylindrical portion thereof, with the vacuum chamber 1 being disposed horizontally with respect to a supporting planar surface. A distributor box 5 and a high-vacuum pump 6 are connected to the vacuum chamber 1 on the side opposite of the microwave source 2, the waveguide 3, and the horn antenna 4. An evaporator bank 7 is secured centrally and axially in the vacuum chamber 1.

Figure 4:
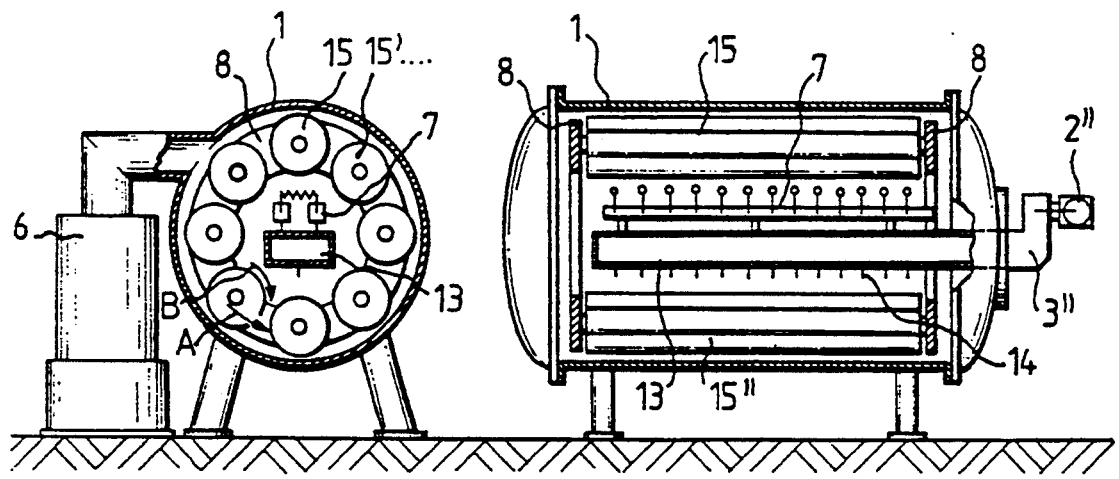
FIG. 4 is both a cross-sectional view and a longitudinal cross-sectional view of the apparatus, having a plasma source arranged in an axial direction.

The rotary cage 8 is provided for receiving workpieces 9, 9', 9", etc. that are secured at the perimeter, and over the entire length of the rotary cage 8 by a number of holding members 15, 15', 15", etc. (FIG. 4). The rotary cage 8 moves through a plasma 10 that is stationarily generated in the vacuum chamber 1. The plasma is co-axially arranged around the evaporator bank 7.

Figure 2:
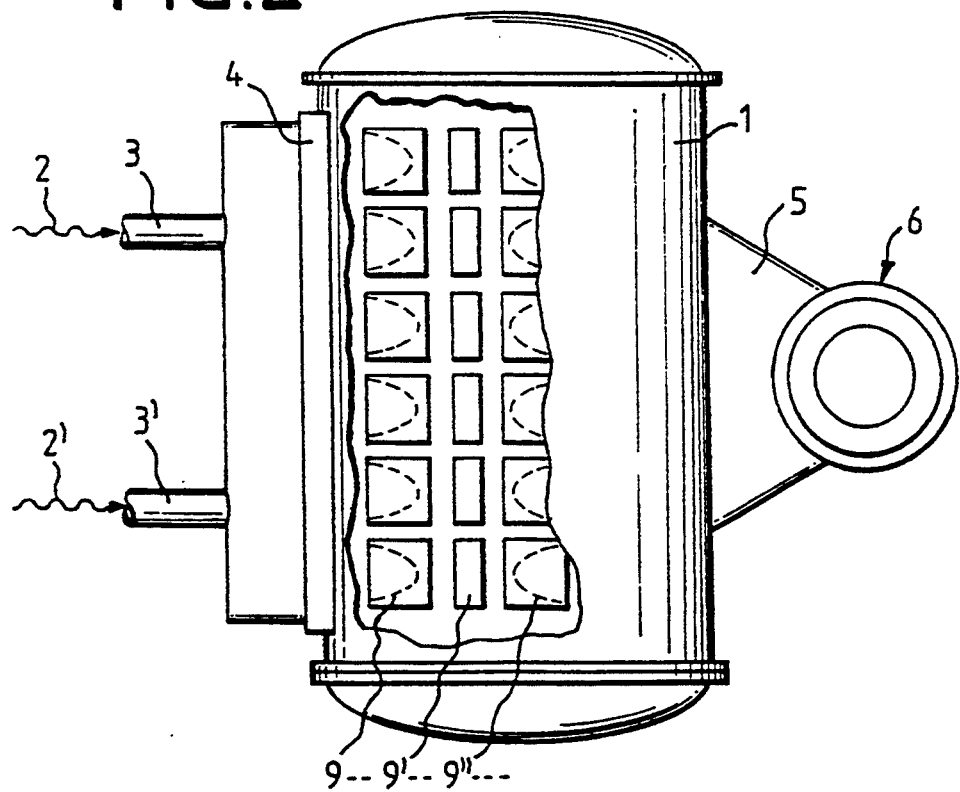
FIG. 2 is top view of the apparatus illustrating a sectional view of a portion of a rotary cage within the cylindrical vacuum chamber.

Referring now to FIG. 2, two microwave sources 2, 2' and waveguides 3, 3' are provided in the vacuum chamber 1. The distributor box 5 is centrally connected along the length of the vacuum chamber 1 to allow for a spatially distributed pumping capacity of the high-vacuum pump 6. The workpieces 9, 9', 9", etc. to be coated are arranged at the circumference and over the entire length of the rotary cage 8.

Figure 3:
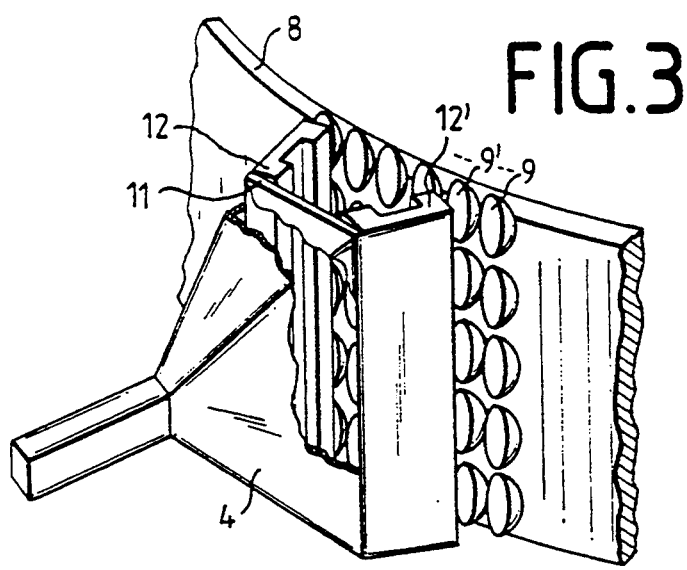
FIG. 3 is a perspective view of a portion of the rotary cage and a horn antenna.

As illustrated in FIG. 3, the horn antenna 4, includes a large aperture and a small aperture, and terminates in a crystal window 11 at the large aperture. A magnet system 12, 12' follows the crystal window. The central longitudinal axis of the horn antenna 4 is aligned to form a right angle with the surface of the rotary cage 8 on which the workpieces 9, 9', 9", etc. are secured.

FIG. 4 is an exemplary embodiment of the apparatus of the invention, wherein a microwave source 2", having its end face arranged at the vacuum chamber 1, is connected to a microwave waveguide 3". The waveguide 3' is further connected to a microwave antenna structure 13, that extends axially from the vacuum chamber 1. Reoccurring coupling elements 14, 14' (illustrated in FIG. 5) are provided by the microwave antenna structure 13. The microwave antenna structure 13 is placed parallel to, and below, the evaporator bank 7. The rotary cage 8 is rotatably seated in a direction A about the central longitudinal axis of the vacuum or process chamber 1. A plurality of holding members 15, 15', etc. are disposed along the perimeter of the cage 8 in a planetary arrangement. The holding members 15, 15', etc. secure the workpieces 9, 9', etc. and rotate in moving direction B about a rotational axis that co-rotates with the rotary cage 8.

Figure 5:
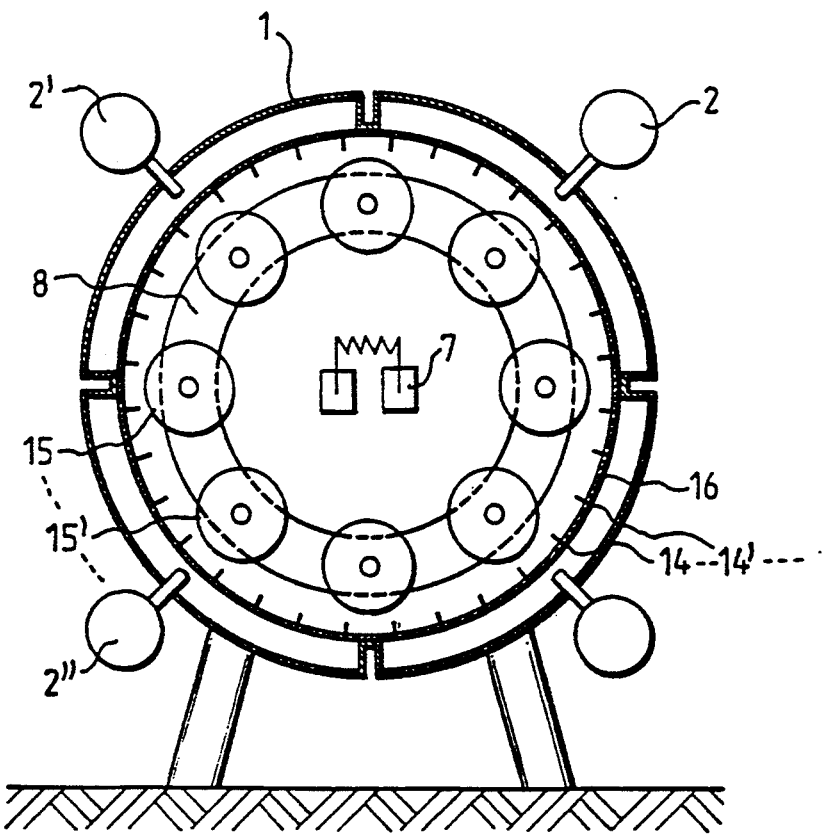
FIG. 5 is a cross-sectional view of the apparatus having plasma sources arranged in an azimuthal direction.

FIG. 5 is another exemplary embodiment of the apparatus of the invention having, a number of magnetrons, or microwave sources, 2, 2', etc. azimuthally distributed, and secured to the vacuum chamber 1. A microwave antenna structure 16, is provided with a plurality of coupling elements 14, 14', etc. that are arranged coaxially relative to the rotary cage 8, and between the rotary cage 8 and the wall of the vacuum chamber 1.

Figure 6:
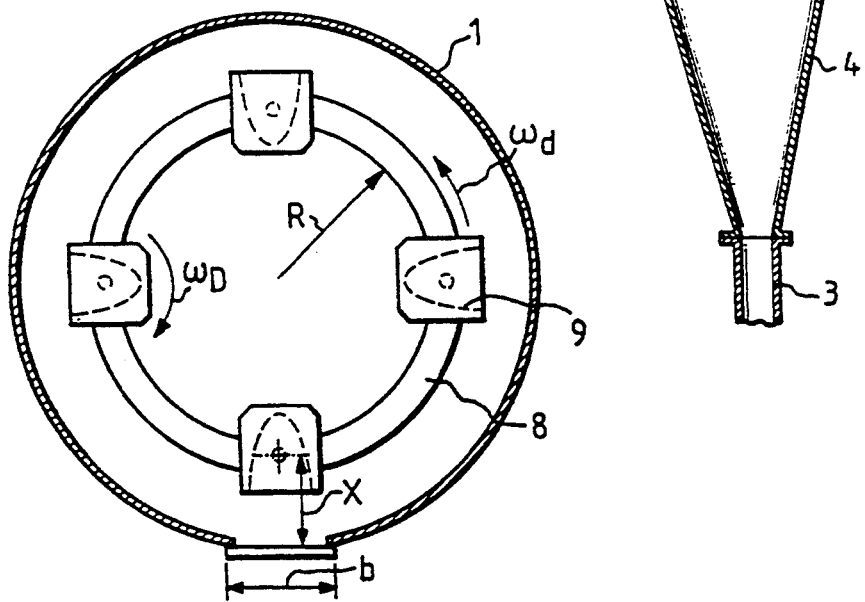
FIG. 6 is diagrammatic figure illustrating a representation of the values needed to calculate the angular velocities around both the central axis and the planetary axis of the rotary cage.

FIG. 6 illustrates the requisite dimensions, R, X, b, for calculating the angular velocities about the central axis of the chamber. The angular velocity vector about the central axis of the chamber $W_D$ rotates in an opposite direction to the angular velocity vector about the inherent planetary axis $W_d$.

Figure 7:
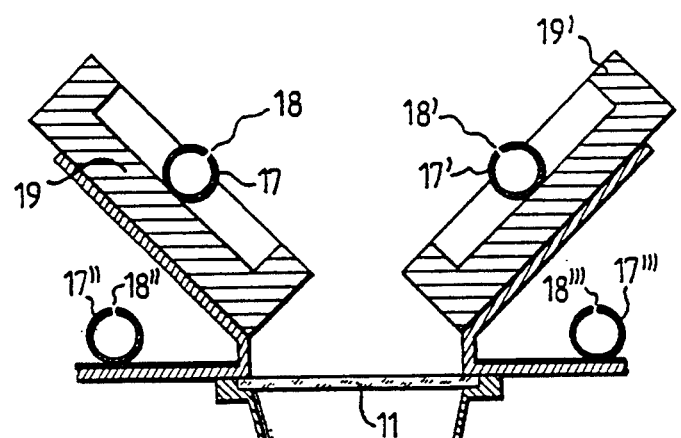
FIG. 7 is a sectional view of the vacuum chamber illustrating the arrangement of the gas distribution conduits therein.

As illustrated in FIG. 7, four gas distribution conduits 17, 17', etc. are provided with repeating bores 18, 18', etc. for supplying process gas into the chamber. The gas distribution conduits 17, 17' are secured between the free magnet poles 19, 19'. A second process gas is introduced into the vacuum chamber 1 with the gas distribution conduits 17", 17'", etc. arranged in the proximity of the magnet poles 19, 19'.

In a preferred embodiment of the apparatus of the invention, a microwave ECR plasma source 2, 2' (as illustrated in FIG. 2) is used. The energy from a 1 MHz to 2.45 GHz microwave field is used to generate a plasma 10 (as illustrated in FIG. 1) for maintaining a glow discharge. The microwaves are generated in a conventional magnetron 2, 2' and are supplied via a waveguide 3 into an antenna 4, such as a horn antenna (as illustrated in FIG. 1).

The antenna 4 contemporaneously assumes the function of a high-vacuum-tight seal for the waveguide region 3 from the interior of the evacuated process chamber 1 to which it is flanged, as illustrated in FIGS. 1 and 2. At a side of the antenna 4 that is adjacent to the vacuum chamber 1, the antenna 4 is framed by an annular magnetic yoke 12, 12'. The yoke is equipped with permanent magnets 19, 19'. The magnet system 12, 12' generates a self-contained, tunnel-shaped magnetic field. The magnitude of the magnetic field satisfies the electro-cyclotron resonant condition for the microwave frequency used in a certain region between the free pole surfaces of the magnets 19, 19'. As a result of the resonant effect, the energy transmission from the microwave source 2, 2' to the electrons contained in the plasma 10 is intensified. The microwave generated plasma source 2, 2' has an extremely high reactivity with the heavy particles compared to DC or RF-generated plasma.

Not only does the resonant effect generated by the magnetic field improve the reactivity with the plasma 10 (as illustrated in FIG. 1), but also the magnetic field reduces containment losses, as a result of the diffusion of the charge carriers. Further, the magnetic field improves the uniformity of the glow discharge along the longitudinal axis of the magnetic yoke 12, 12' (illustrated in FIG. 3) as a result of the drifting motion of the charge carriers.

In a preferred embodiment, the surfaces of the magnet system 12, 12' that are exposed to the plasma 10 include a simple, removable, heatable shield where the shield can be cleaned outside of the system, and can be easily remounted. Because the shield can be heated, less frequent cleaning of the system is required than in the known methods.

A long plasma zone with microwave energy is supplied to the vacuum structure 1 via an antenna structure 4. The antenna structure can be made as a horn antenna 4, as shown in FIG. 3, by which the microwave field 2, 2' emitted from the waveguide 3 is expanded longitudinally in the direction of the magnet system 12, 12'. At a larger aperture of the horn antenna 4, illustrated in FIGS. 1, 2, 3, and 7, a crystal window 11 functions as a microwave-transmission vacuum seal for the vacuum chamber 1. The resulting apparatus is well suited to coating and treating workpieces having complicated, three-dimensional surfaces.

Three possible embodiments for the microwave plasma source, in coating systems having a cylindrically-shaped process chamber 1 are illustrated in FIGS. 1, 4 and 5, in which a rotary cage 8 having planetary gearings 15, 15', etc. is used to secure the workpieces 9, 9', 9'', etc. to be coated. In one such embodiment, the plasma source 3 can be inserted into an outside jacket of a cylindrical base of the process chamber 1 in an axial direction, as illustrated in FIG. 1. In another embodiment, the plasma source 3 is disposed parallel to the longitudinal axis of the chamber, as illustrated in FIG. 4. In yet another embodiment, the plasma source is disposed azimuthally, as illustrated in FIG. 5. Placement of the plasma source in accordance with any of these embodiments results in a suitable configuration for an in-line system.

In operating the apparatus of the invention, the microwave source, or transmitter, 2, 2' (illustrated in FIG. 2) can be operated in either a pulsed or a continuous mode. In a preferred embodiment, the transmitter is operated in a pulsed mode. In a pulsed mode, a gas exchange that results in a more uniform layer quality and rate distribution, occurs in the plasma off-times, particularly at locations that are not reached by the gas flow in the vacuum chamber 1. For example, locations can exist on three-dimensional workpieces having complicated shapes that are not reached by the gas flow. To produce evenly distributed coatings on workpieces 9, 9', 9'', etc., the pulsed mode is preferred.

In a preferred embodiment, a rotary cage 8 is used to achieve optimum coating results. For example, as illustrated in FIG. 6, when the inside surfaces of concave workpieces 9, 9', 9'', etc. are to be coated, the angular velocities and phases of planetary motion of the rotary cage 8 and the holding members 15, 15', etc., must be matched to each other in a specific way, and the plasma source placed in the outside jacket in an axial direction, to achieve optimum coating results. To match the planetary motions, the angular velocity $w_D$ around the central axis and the angular velocity $w_d$ around the inherent planetary axis measured relative to the cage system rotating at the angular velocity $w_D$ are given by:

$$\frac{w_d}{w_D} = \frac{-\pi}{2 \arccos \frac{Rxx}{\delta} + \arccos \frac{R}{\delta}},$$

where $$\delta = \left[ \frac{b^2}{4} + (R + x)^2 \right]^{\frac{1}{2}}.$$

FIG. 6 is a diagrammatic illustration of the values used in the above expression. To achieve optimal uniform coating of the workpieces 9, 9', etc., the phase of rotation of the holding members 15, 15', etc. about their central axes are chosen such that the greatest area of projection of the protective coating onto the inside surface of concave workpieces 9, 9', etc. is maximized on a plane perpendicular to the coating source direction at the moment the holding members 15, 15', etc are closest to the coating source 10.

When a batch system is used that does not have an outward transfer chamber, the plasma source can be arranged along the axis of symmetry of the cylindrical base of the vacuum chamber 1, as illustrated in FIG. 4.

In another embodiment, the coating process can be used in an in-line system (not shown). In such an embodiment, the workpieces 9, 9', etc. attached to the holding members 15, 15', etc. are not rotated about a common axis, but rather, are continuously longitudinally conducted through the system by a linear drive. In such a system, the longitudinal axis of the plasma source is disposed perpendicularly to the plane through which the workpieces 9, 9', etc. attached to the holding members 15, 15', pass.

In a preferred embodiment of the invention, the gas distribution conduits 17, 17' are arranged in accordance with the illustration of FIG. 7. This arrangement yields the best protective coating layers with the highest process reliability. The gas distribution conduits 17, 17' that deliver the gas, containing silicon and carbon, to the vacuum chamber 1 are mounted between the free magnet poles 19, 19'. When a second gas, such as oxygen, is used in addition to a first gas, this gas can be admitted into the vacuum chamber 1 in the proximity of the magnetic yoke 12, 12'.

To deposit a uniform coating onto the workpieces 9, 9', etc., a number of factors must be considered. First, some of the organosilicon compounds used for the protective coating and pre-coating processes have very low vapor pressures at room temperature. In order to assure a sufficient mass flow for a large-area coating process, the workpieces 9, 9', etc. must be heated to a temperature ranging from 70° to 80° C., and must then be evaporated in a suitable evaporator at these temperatures. Therefore, all monomer conduits that follow the evaporator downstream must be maintained at exactly the same temperature as the evaporated gas to be heated. In order to make the coating more uniform, the monomer can enter into the process chamber 1 through the conduits 17, 17' (illustrated in FIG. 7) used to distribute the heated gas.

Further, for monomer/process gases that are easily condensed, such as trifluoromethane or hexamethyldisiloxane, the pumping capacity can be selectively varied within a broad range, using a low-temperature surface, without the pumping capacity noticeably varying for process gases having a low condensation point. (For example, A900H having a pumping capacity for HMDSO between 300 and 4200 l/s, given an $O_2$ pumping capacity, of approximately 2000 l/S.) The pumping capacity is regulated by the temperature of the low-temperature surface and/or by a preceding valve. Such an arrangement allows for variation of the process gas/monomer mixtures and of the gas/monomer-associated dwell times of the process gases/monomers within the process chamber 1. Thus, the coating compositions and properties can be varied within a broad range.

In addition, uniform distribution of the pumping capacity along the longitudinal axis of the plasma generator, due to the coupling of the high vacuum pump 6 to the process chamber 1, provides a uniform gas delivery. As illustrated in FIG. 1, the pump 6 is connected to the process chamber 1 via a distributor box 5, as illustrated in FIG. 1. A uniform gas delivery, through the gas distribution conduits 17, 17', and a uniform plasma 10, form a coating means for uniformly coating the workpieces 9, 9', etc. secured to the holding members 15, 15'.

The coating means for uniformly coating the workpieces 9, 9', etc. secured to holding members 15, 15' (illustrated in FIG. 5) can be sensitively disturbed when the workpieces 9, 9', etc. are conducted through a coating zone with a planetary motion. This disturbance is further pronounced for coating processes performed under greater pressures. Thus., the more viscous the plasma flow conditions are, particularly in the coating zone, the more pronounced the disturbance to the uniformity of coating.

Thus advantageously, low process pressures, ranging from $1 \times 10^{-4}$ to $1 \times 10^{-2}$ mbar, can be achieved with the microwave ECR plasma source 2, 2' (illustrated in FIG. 2). At these pressures, the flow between the plasma 10 and the workpieces 9, 9', etc. is capable of becoming nearly molecular. The deposition rate at these low pressures is satisfactorily high, and the layer quality is excellent, as verified by measurement. As a result, the typical narrow boundary conditions for large-area coating in the vacuum chamber 1 are optimized.

Further, a rotary cage 8, having exactly the same phase and angular frequency as the holding members 15, 15' (illustrated in FIG. 5), used to secure the workpieces 9, 9', etc. to be coated, is especially useful for producing a uniform spatial rate distribution on three-dimensional workpieces.

For depositing hard, dense layers onto workpieces 9, 9', etc., (illustrated in FIG. 1) an ion-assisted deposition process can be used. Depending on the conductivity of the workpieces 9, 9', etc., an RF, MF, or DC bias supply can place a positive potential, or bias, on the workpieces 9, 9', etc. via the cage 8, where the bias is insulated from ground, and integrated into the system.

For dielectric workpieces, the metallization process can also be used to generate a conductive surface that simultaneously produces an electrical connection with the rotary cage. As a result, ion-assisted deposition onto dielectric workpieces is possible.

A heater that is built into the inward transfer chamber 1 serves the purpose of densifying and hardening the layer being deposited. This heater can raise the temperature of heat-resistant workpieces during the lock conditioning. A holding heater that stabilizes the workpiece temperature during the coating process is installed in the process chamber 1. As a result, the walls of the process chamber 1 and the workpieces 9, 9', etc. (illustrated in FIG. 1) are heated contemporaneously with the holding members 15, 15' (illustrated in FIGS. 4 and 5). The layers deposited on the walls and the holding members 15, 15' adhere well, and only become detached after the system has been operated for a long time. Thus, heating the process chamber 1 lengthens the time interval between cleaning cycles, thereby increasing the productivity of the system.

The present invention provides a method for coating workpieces 9, 9', etc. in a vacuum chamber 1 using a microwave ECR plasma coating source 2, 2' (Illustrated in FIG. 2).

A pre-treatment can be applied to the workpieces 9, 9', etc. in a gas atmosphere composed of a (per) fluoridated carbon compound, such as $CF_4$, at a partial pressure ranging from 0.1 $\mu$bar to 1 mbar, and $O_2$, at a partial pressure ranging from 0.25 $\mu$bar to 1 mbar. In the embodiment, the microwave power ranges from 100 W to 1 kW for every 0.5 m of plasma length. The pumping capacity ranges from 100 l/s to 2000 l/s nitrogen for every 0.5 m of plasma length. The spacing of the workpieces 9, 9', etc. from the plasma source ranges from 2 cm to 1 m. The treatment continues for 10 seconds to 2 minutes. This pre-treatment noticeably increases the adhesion to the workpieces 9, 9', etc. of layers subsequently applied thereto, thereby improving the corrosion of the resulting workpieces.

A non-coating plasma pre-treatment can be applied to the workpieces 9, 9', etc. in an oxygenous and/or nitrogenous atmosphere. Such a pretreatment can be achieved by using a process pressure ranging from $2 \times 10^{-2}$ to 1 mbar, having a microwave power ranging from 100 W to 1 kW for every 0.5 m of plasma length, a pumping capacity between 100 l/s and 2000 l/s oxygen, spacing of the surfaces of the workpiece 9, 9', etc. from the plasma ranging from 5 cm to 1 m, treatment duration ranging from 0.1 to 10 seconds, and process gases, for example, selected from the groups consisting of $O_2$, $H_2O$, $N_2O$, $NH_3$ and $N_2$.

Such a pre-treatment effects the function of the surfaces of the workpieces 9, 9', etc. where functional groups, such as hydroxyl, carbonyl or amino groups, are generated on the workpiece surface resulting in improved adherence to the workpieces 9, 9', etc. of the subsequently applied layers.

In an embodiment of the method of the invention, the workpieces 9, 9', etc. are heated to the highest temperature allowed for the given workpiece material, up to 300° C. The surface of the workpiece can then be leveled by a chemical process.

In a chemical leveling process, a 1–5 $\mu$m thick PCVD layer is applied to the pre-treated workpieces 9, 9', etc. thereby leveling the rough surfaces. The advantage of applying a PCVD layer over lacquers applied in a wet-chemical process is that PCVD layers can be heat-resistant up to 600° C. However, such a leveling process is only suitable for workpieces 9, 9', etc. having a high market value in comparison to the process cost, due to the long process time required to level the layers. After a pre-treatment is applied to the workpieces 9, 9', etc., the workpieces 9, 9', etc. can be coated with protective coating layers.

The surfaces of the workpieces 9, 9', etc. whether pre-treated or not, can be coated with an adhesion-promoting layer, vis-a-vis aluminum, in a gas atmosphere consisting of an organosilicon compound, containing principally silicon, carbon and hydrogen, such as tetramethylsilane or hexamethyldisiloxane, at a partial pressure ranging from 0.1–10.0 μbar. Alternatively, a hydrosilicon, such as siliconethane, is mixed with a hydrocarbon, such as $CH_4$, $C_2H_2$, benzene, or an organosilicon compound, and an oxygenous gas, such as $N_2O$, where the gas mixture is at a pressure ranging from 0.1–12.0 μbar. Either embodiment requires microwave power ranging from 200 W to 2 kW for every 0.5 m of plasma length, an additional workpiece bias potential, which is no greater than 100 V, and a pumping capacity ranging from 600 l/s to 4000 l/s Hexamethyldisiloxane for every 0.5 m of plasma length. Further, spacing between the plasma source and the front workpiece edge should range from 2–20 cm. The gas composition should contain silicon, carbon and oxygen, with greater than 20 at % Si, less than 50 at % C, and no less than 30 at % $O_2$, with a layer thickness of from 20–800 Å.

The purpose of the pre-treatment is to further improve the adhesion of the metal layer to be applied to the workpieces 9, 9', etc. in the next process step. The effect of the adhesive layer is significant, particularly for improving the corrosion-resistance of the layer system.

Pre-treatment minimizes exposure of the surfaces of the workpieces 9, 9', etc. to corrosive agents. Satisfactory adherence of layers to the workpieces 9, 9', etc. prevents the penetration of aggressive agents, proceeding from either pin windows or mechanical injury to the layer system, between the aluminum layer and the pre-coating or the aluminum layer and the workpiece surface resulting from the capillarity of these layers.

Pre-coated workpieces 9, 9', etc. can be metallized with a metal layer, such as an aluminum layer, of from 700 Å to 2 μm thick. The metal layer can be applied by either a vapor-deposition process or a sputtering process. For workpieces 9, 9', etc. having complicated, three-dimensional surfaces, including undercuts that must be coated, a sputtering gas pressure of more than 6 μmbar, using an optimally heavy inert gas within a reasonable price range, such as crypton, is preferred.

A non-coating plasma after-treatment can be deposited on the metal layer by superficially oxidizing the metallized layer with plasma in an oxygenous process atmosphere. Process gasses, such as oxygen, water, and nitrous oxide, combined with other process gases, such as helium and argon, can be processed at pressures ranging from 0.1 μbar to 1 mbar. The pumping capacity ranges from 300 to 2000 l/s oxygen for every 0.5 m of plasma length. The process is no more than 1 minute in duration. The process improves the abrasion resistance of the metal layer.

A protective coating can be applied to the workpieces 9, 9', etc. by coating the previously metallized workpieces in a further PCVD process. An organosilicon gas compound containing silicon, carbon, oxygen and hydrogen, such as hexymethyldisiloxane (HMDSO), tetramethyldisiloxane (TMDS), tetramethylcyclotetrasiloxane, or tetraethoxysilane (TEOS), is applied at a partial pressure ranging from 0.1 to 10 μbar. Such a gas can contain oxygen at a partial pressure ranging from 0 to 9.9 μbar, or hydrosilicon, such as monosilane, at a partial pressure ranging from 0.1 to 6 μbar, an oxygen carrier, such as nitrous oxide ($N_2O$) at a partial pressure ranging from 0.1 to 9.9 μbar, and a hydrocarbon, such as hexane or an organosilicon compound, at a partial pressure ranging from 0.5 to 8 μbar. Additionally, the microwave power ranges from 200 W to 2 kW for every 0.5 m of plasma length. An additional workpiece bias of no more than 600 V is applied. The pumping capacity ranges from 600 l/s to 2000 l/s nitrogen and from 300 l/s to 4000 l/s hexamethyldisiloxane for every 0.5 m of plasma length. The workpiece can be spaced from 2 to 20 cm from the plasma, where the desired layer thickness ranges from 80 to 1000 A. The resulting layer contains oxygen, silicon and carbon. Proportions of these elements are greater than 20 at % oxygen, greater than 20 at % silicon, and 30 to 60 at % carbon.

In corrosion tests, such a protective-coating layer has approximately twice the corrosion-resistance of the protective-coating layers manufactured with the previously known method, as discussed below.

The protective-coated workpieces 9, 9', etc. can be further coated with a fluoridated top layer, or alternatively, a fluoridated protective coating by a further PCVD process. Such a coating can be achieved in a gas of an organosilicon compound containing silicon, carbon, oxygen and hydrogen, such as tetramethyldisiloxane, or tetraethyloxysilane, at a partial pressure ranging from 0.1 to 10 μbar, or in a mixture composed of a hydrosilicon, such as silicoethane, at a partial pressure ranging from 0.1 to 10 μbar, an oxygen carrier, such as $N_2O$, at a partial pressure ranging from 0 to 9.9 bar, and a (per) fluoridated gas, such as tetrafluoromethane, hexafluoropropylene, or a fluoridated organosilicon compound, such as methyltrifluorosilane, with the optional addition of oxygen at a partial pressure ranging from 0 to 9.9 μbar. A microwave source is delivered with power ranging from 200 W to 2 kW for every 0.5 m of plasma length. An additional bias of no greater than 200 V, is applied to the workpiece. The pumping capacity ranges from 600 l/s to 2000 l/s nitrogen and between 300 l/s and 4000 l/s hexamethyldisiloxane for every 0.5 m of plasma length.

The workpiece is spaced 2 to 20 cm from the plasma source. A desired layer thickness is in the range of 80 to 1000 Å.

The purpose of this top layer is to improve the corrosion-resistance and the optical properties of the protective layer. The corrosion-resistance of the protective layer is improved by producing a chemically inert protective layer. The optical properties of the protective layer are improved by lowering the resulting refractive index of the workpieces 9, 9', etc. and improving the reflection of the workpieces 9, 9', etc. with the introduction of fluorine.

A hydrophilic top layer, having an optimally oxygen-rich organosilicon compound, is applied to the protective-coated workpieces 9, 9', etc., such as TEOS or HMDSO. The top layer is applied at a partial pressure of from 0.1 to 2 μbar, or by applying a hydrosilicon, such as monosilane, at a partial pressure of from 0.1 to 9 μbar, with oxygen at a partial pressure ranging from 1 to 10 μbar, and H₂O at a partial pressure of from 1 to 15 μbar. A microwave source having power ranging from 100 W to 2 kW for every 0.5 m of plasma length is delivered to the plasma. An additional workpiece potential of no more than 200 V is applied. A pumping capacity ranging from 600 l/s to 2000 l/s nitrogen and ranging from 300 l/s to 2000 l/s hexamethyldisiloxane is chosen, where the pumping capacity can be selectively varied for readily condensed monomers, for every 0.5 m of plasma length. The workpieces 9, 9', etc. are spaced 2 to 30 cm from the plasma source. A layer thickness of up to 2 μm is desired, through 50Å is the preferred layer thickness.

The hydrophilic top layer is applied to cover the corrosion-resistant fluoridated top layer, that is generally not hydrophilic, with a hydrophilic layer. Drops of condensed water that collect on the hydrophilic surface run within a short time, and unite to form a closed water film. This closed water film does not effect the optical function of the inside reflector surface in contrast to a number of drops of condensed water being placed in close proximity to each other.

By reducing or eliminating the phase boundary air-/water/protective layer, corrosion resistance of the layer packet is increased, and thus, a lengthened service life results.

A SiC or SiCO protective coating, produced according to the protective coating process described above, can also be superficially oxidized by a plasma treatment in an oxygenous atmosphere. As above, a process gas, such as $O_2$ or $N_2O$, at a pressure ranging from $1 \times 10^{-4}$ to 1 mbar, with an additional bias of less than 800 V, is applied to the workpieces 9, 9', etc. in the system. The process further requires a pumping capacity of 400 to 2400 l/s oxygen for every 0.5 m of plasma length, and a microwave source 2, 2' having power of from 500 W to 3.5 kW for every 0.5 m of plasma length. The front edges of the workpieces 9, 9, etc. are spaced from 20 cm to 40 cm from the plasma source.

A catalytic effect can be achieved for the PCVD coatings of the leveling layer step, adhesion promoting layer step, protective coating layer step, fluoridated protective coating step, and hydrophilic top layer step. The catalytic effect is achieved by admixing metals in the form of metal halogenides, such as tungsten hexafluoride or a metallo-organic, with the process gas. The metallo-organic can be diethylzinc or iron-pentacarbona. The PCVD coating can also be applied to the workpieces 9, 9', etc. by simultaneous evaporation or cathode sputtering of metals, such as platinum or copper, together with water, steam, and/or oxygen. For instance, the addition of copper catalytically effects the compounding of silicon and carbon.

The present invention provides numerous advantages. The resultant workpieces have a longer service life than workpieces processed by the known methods. The results of the corrosion test carried out on motor vehicle reflectors, according to FIAT standard 5.00435, advantageously show that the parts coated in accordance with the method disclosed herein typically have a service life that is three times longer, even where the parts are manufactured in a batch process, than parts manufactured according to the traditional method. Where the addition of a bias voltage is applied to the workpiece surface, and the workpiece temperature is maintained at a minimum of 70° C., the already highly smear-resistant layers can achieve an even higher density, corrosion-resistance, and abrasion-resistance.

Additionally, as the process can produce workpieces having extremely high corrosion-resistance, the thickness of the layers can be reduced to as much as 100 Å. Thus, a thickness of approximately one-third the layer thicknesses achieved with the known process can be achieved with the present invention. Advantageously, a workpiece of this thickness has both greater reflectivity, and optical clarity.

Finally, the coating process can be continuously operated using the apparatus herein disclosed. Thus, the apparatus can be integrated in throughput systems to be continuously, and cost-beneficially, operated. Further, the contamination of the process chamber walls, the process atmosphere, and ultimately, the workpiece surfaces, with fine dust particles that occurs when flooding the process chamber, is noticeably reduced as compared to the contamination produced by the traditional method using a DC-PCVD. Thus, the inventively manufactured layers can grow largely free of corrosive prone packets, and the service life of the system is noticeably lengthened, compared to the service life of the known process, and initially only requires cleaning in the immediate vicinity of the plasma generator. The remaining portions of the process chamber, including the rotary cage, need not be cleaned, in contrast to the known process, which requires more frequent, and therefor costly, cleaning procedures.

Moreover, the microwave ECR plasma coating source allows for pressures on the order of 1 μbar to be obtained while treating or coating large areas. Typically, these areas have dimensions in the range of a meter. Spacings between the holding members and the sides of the vacuum chamber usually range from 20 cm to approximately 1 meter. Reproducible conditions relating to the local flow conditions, local dwell times, and local partial pressure conditions of the gaseous ducts used, and their gaseous products, relate specifically to the amount of fine-dust generated by the volume polymerization. In most cases, these conditions can only be achieved when it is possible to work in the molecular, or at least weakly viscous, pressure range in a large-scale system. The systems under discussion here typically have an average free path length of at least 30 cm. This path length corresponds to pressures on the order of 1 μbar. Pressures within this magnitude cannot be achieved with a DC-PCVD process.

Still further, the resulting layer thickness is advantageously uniform. For example, given a partial pressure ratio between an organosilicon compound, such as TEOS or HMDSO, and oxygen of approximately 1:3, with a total pressure of approximately 1 μbar, results in a uniform layer thickness of 1:1.1, with reference to the layer thickness in the apex, at the outermost edge and within a depth of approximately 30 cm, for a statically coated parabolid. At noticeably higher pressures and lower oxygen content, the uniformity of layer thickness is still 1:2.

The effect of the above-described pre-treatment and pre-coating on the resulting workpiece has been demonstrated by the tests set forth below.

In one test, a base reflector, approximately two months old, having a base lacquer that was heavily contaminated with dust, as a result of poor storing conditions, was pre-treated with the above-described microwave plasma source in an atmosphere containing fluorine, carbon, and oxygen. The pre-coat included a SiC:H or SiCO:H layer. The base reflector was metallized and protective-coated with a SiCO:H protective layer. A set of parameters are listed in the example below. A second reflector was also contaminated and processed in the same manner, but without the pre-treatment and the pre-coating. Both specimens were tested with respect to their corrosion-resistance in a caustic soda test, conforming to the afore-mentioned FIAT standard. The metallized reflector, without pre-treatment, resisted corrosion for only 15 minutes. On the other hand, no corrosion was detected on the pre-treated reflector, even after a testing time of more than 15 hours.

To prepare the workpiece on which the corrosion test is performed, an LH system A900H—batch system, 0.9 m in diameter, having a rotary cage, microwave source, and horn antenna axially installed in the outside wall of the vacuum chamber, is filled with pre-lacquered, three-month old motor vehicle headlight reflectors as workpieces. The workpieces are neither stored in a dust-free atmosphere, nor pre-cleaned. The following parameters are used to fabricate the test workpiece: A pumping capacity of 2000 l/s $N_2$, and 3000 l/s HMDSO, basic background pressure of $1 \times 10^{-4}$ mbar, a partial pressure of 1.00 $\mu$bar for TMS, a microwave power source of 1 kW, and a cage speed of 10 rpm for a one minute coating duration, are applied to the system while the vacuum pump background is down to a basic background pressure. An aluminum layer is applied by vapor-deposition to provide a layer, approximately 1500 Å thick, at a partial pressure of 0.2 $\mu$bar, with a microwave source delivering 1 kW of power, a cage speed of 10 rpm, and a coating duration of three minutes. The chamber is then flooded.

The corrosion test is then performed on the test batch in 0.2% NaOH solution. Using the above-described procedure, such a test was performed on five coated reflectors. After 15 hours of testing, corrosion could not be found with the naked eye on any of the five coated reflectors. In addition, a damp heat test was performed at 40° C. Corrosion could not be found on any of the reflectors after six weeks. In testing the reflectivity of the reflectors, 85% of the reflectors were in the spatial and spectral mean, 400–750 nm.

Another test batch, having the same system arrangement and workpieces as above, and a partial pressure of HMSO, 0.25 $\mu$bar, where the partial pressure of oxygen is 1.0 $\mu$bar, a static coating is delivered via a microwave source of 1 kW. A subsequent measuring of the rate distribution within the reflectors yields 1.2:1.0, as the ratio of the layer thicknesses at the edge placed closest to the source. Conducting a rotary past the coating source cage results in a rate distribution within the reflectors yielding 2.3:1.0, as the ratio of the layer thickness at the edge placed closest to the source.

In another test batch, the above-system included TEOS at a partial pressure of 0.1 $\mu$bar $O_2$ at a partial pressure of 4 $\mu$bar, and $H_2O$ at a partial pressure of 4 mbar. Measuring the resulting contact angle when water is applied to the test workpiece resulted in a contact angle of at most 15°.

In a further test batch, the above system is followed through the application of the aluminum layer. Subsequent to the application of the aluminum layer, a protective coating layer is applied with HMDSO at a partial pressure of 100 mbar, $CF_4$ at a partial pressure of 0.2 $\mu$bar, and at a cage speed of 10 RPM. A 10 kW microwave source is delivered, and a pumping capacity of 700 l/s HMDSO and 1000 l/s $CF_4$ is used for a time coating duration of 160 s. The chamber is then flooded.

The reflectivity of a test batch reflector tested after applying these parameters was 88% within a spectral mean of 400–750 nm. The corrosion-resistance improved by 23%, compared to test batches not having a fluoridated protective coating applied.

Although other modifications and changes may be suggested by those skilled in the art, it is the intention of the inventors to embody within the patent warranted hereon all changes and modifications as reasonably and properly come within the scope of their contribution to the art.

We claim:

1. An apparatus for producing layers of arbitrary thickness on a surface, to be operated as a batch system using a plasma chemical vapor deposition coating process comprising:
   a) a vacuum chamber:
   b) a rotary cage, having a number of holding members rotatably secured to the rotary cage, arranged in the vacuum chamber such that the rotary cage is capable of rotation with a frequency-matched and phase-matched planetary motion with respect to the holding members, the rotary cage being adapted to secure workpieces thereto;
   c) a microwave ECR plasma coating source, including a microwave field operated at a frequency ranging from 1 MHz to 2.45 GHz; and
   d) means for supplying gas to and removing gas from the vacuum chamber including a plurality of heated gas distribution conduits for carrying processed gases, the heated gas distribution conduits being mounted between a plurality of free magnet pulls in the vacuum chamber.

2. The apparatus of claim 1 further comprising:
   a microwave transmitter for generating plasma operated in a pulsed mode.

3. The apparatus of claim 1 further comprising:
   a microwave transmitter for generating plasma operated in a continuous mode.

4. The apparatus of claim 1 further comprising:
   a high vacuum pump, having a selectively variable pumping capacity, connected to the vacuum chamber.

5. The apparatus of claim 4 further comprising:
   a controllable valve for selectively varying pumping capacity of the high-vacuum pump.

6. The apparatus of claim 5 wherein the controllable valve precedes the high-vacuum pump.

7. The apparatus of claim 1 further comprising:
   a bias supply for applying a potential voltage to the surface of the workpiece by means of the rotary cage insulated vis-a-vis ground.

* * * * *